United States Patent [19]
Hazama

[11] Patent Number: 5,856,691
[45] Date of Patent: Jan. 5, 1999

[54] ELEMENT-TO-ELEMENT INTERCONNECTION IN SEMICONDUCTOR DEVICE

[75] Inventor: Katsuki Hazama, Tokyo, Japan

[73] Assignee: Nippon Steel Corporation, Tokyo, Japan

[21] Appl. No.: 802,354

[22] Filed: Feb. 21, 1997

[30] Foreign Application Priority Data

Feb. 23, 1996 [JP] Japan .................................... 8-061864
Feb. 23, 1996 [JP] Japan .................................... 8-061865

[51] Int. Cl.⁶ .................................................. H01L 29/788
[52] U.S. Cl. ............................................ 257/316; 257/326
[58] Field of Search .................................... 257/316–326; 438/258, 266

[56] References Cited

U.S. PATENT DOCUMENTS 4,426,764  1/1984  Kosa et al. ................................ 29/571
5,557,566  9/1996  Ochii ...................................... 257/316

FOREIGN PATENT DOCUMENTS

A-3-234062  of 1991  Japan .
A-6-283688  of 1994  Japan .

Primary Examiner—Valencia Martin-Wallace
Assistant Examiner—David B. Hardy
Attorney, Agent, or Firm—Pollock, Vande Sande & Priddy

[57] ABSTRACT

A semiconductor device and a method of making the same. The semiconductor device comprises a semiconductor substrate, a transistor including a gate electrode having a first conductive layer formed on the semiconductor substrate and a second conductive layer formed thereon and a pair of impurity diffusion layers, and an electric element including a third conductive film positionally separated from the transistor formed on the semiconductor substrate and a fourth conductive layer formed on the third conductive layer wherein an insulating layer is formed between the third and fourth conductive layers, the fourth conductive layer extends to connect directly to one of the pair of impurity diffusion layers, the first and third conductive layers are made of the same conductive material, and the second and fourth conductive layers are made of the same conductive material.

10 Claims, 18 Drawing Sheets

ELEMENT-TO-ELEMENT INTERCONNECTION IN SEMICONDUCTOR DEVICE

BACKGROUND OF THE INVENTION

1. Field of the Invention

The present invention relates to element-to-element interconnection in a semiconductor device and more particularly, to connection between an impurity diffusion layer of a transistor and another element in a semiconductor device.

2. Description of the Related Art

In constructing a semiconductor device, it is often necessary to connect an impurity diffusion layer of a transistor constituting one element of the semiconductor device to a different element. For example, when the different element is a gate electrode of the transistor, the conventional connection is such that a polycrystalline silicon layer constituting the gate electrode is connected directly to the impurity diffusion layer of the transistor or the polycrystalline silicon layer constituting the gate electrode is connected to an overlying metal wiring line and the metal wiring line is connected to the impurity diffusion layer of the transistor. When the former method is used, a gate oxide film formed at a portion of the surface of a semiconductor substrate where the impurity diffusion layer of the transistor is to be formed is removed by wet-etching using a resist film as a mask to form an opening and thereafter, the polycrystalline silicon layer constituting the gate electrode is extended up to the opening. In this method, however, in a step for removal of a resist film following the partial removal of the gate oxide film by using the resist film, the quality of the gate oxide film may possibly be deteriorated and reliability of the semiconductor device may be degraded. The former method may be applied to an SRAM with a configuration disclosed in, for example, JP-A-3-234062.

The latter method as applied to an EEPROM will be described with reference to FIGS. 11 to 14.

Some of non-volatile semiconductor memory devices having memory cell transistors with floating gate such as EEPROM's have transistors for word line select adapted to select on/off of individual word lines. FIG. 11 shows an equivalent circuit of an memory cell array of this type of non-volatile semiconductor memory device. In this memory cell array, eight memory cell transistors 12 each having a floating gate 11 to store data are connected to one word line 13 or a control gate.

Each of the memory cell transistors 12 has a drain connected to a bit line 15 through a select transistor 14 and a source connected to a common source line 16. A word line 13 is connected to a select line 18 through a transistor 17 for word line select and a gate electrode of the word line select transistor 17 and gate electrodes of the select transistors 14 are connected to a select gate line 19.

In this memory cell array, in order to access one of the memory cell transistors 12, a word line 13 connected to a particular word line select transistor 17 is first selected by selecting a select gate line 19 and the discrimination between, for example, a memory cell transistor 12a and a memory cell transistor 12b which are connected to the same word line 13 is effected by selecting a bit line 15.

Although the memory transistor 12a and a memory transistor 12c, for example, are connected to the same bit line 15, only one select gate line 19 is selected and hence only a select transistor 14 paired with, for example, the memory transistor 12a is rendered conductive but a select transistor 14 paired with the memory transistor 12c is not rendered conductive, thus preventing the memory transistor 12c from being accessed.

FIGS. 12 and 13 show a structure of the memory cell array shown in FIG. 11. FIG. 12 is a sectional view taken along line (XII—XII of FIG. 13) which extends from a portion where the select line 18 is connected to the drain of the word line select transistor 17 along the word line 13, while crossing the select gate line 19. In this example, the element isolation regions are defined by silicon oxide films 22 selectively formed in the surface of a silicon substrate 21, and a silicon oxide film 23 serving as a gate insulating film of the word line select transistor 17 and a silicon oxide film 29 serving as a tunnel insulating film of the memory cell transistor 12 are formed on the surface of element active regions each surrounded by the silicon oxide films 22.

The floating gate 11 and a lower layer of the select gate line 19 are formed by a first layer of polycrystalline silicon film 24 on the silicon substrate 21 and a capacitive coupling insulating film of the memory cell transistor 12 is formed by an ONO film 25 covering the floating gate 11. Then, the word line 13 and an upper layer of the select gate line 19 are formed by a second layer of polycrystalline silicon film 26 on the silicon substrate 21.

In the element active regions, impurity diffusion layers 27a and 27b serving as a source and a drain of the word line select transistor 17 and impurity diffusion layers (not shown) serving as sources and drains of the memory transistor 12 and select transistor 14 are formed on both sides of the polycrystalline silicon films 24 and 26. The word line 13 and select gate line 19 are covered with an inter-layer insulating film 28 and contact holes 31 to 33 reaching the word line 13 and the impurity diffusion layers 27a and 27b are formed in the inter-layer insulating film 28.

Then, the wiring line 35 extending between the contact holes 31 and 32 to connect the word line 13 and the impurity diffusion layer 27a, the select line 18 connected to the impurity diffusion layer 27b through the contact hole 33, the bit line 15 and the source line 16 are formed of metal films 34. In FIG. 13, 121 indicates a region at which the first layer of polycrystalline silicon film 24 is to be removed through the first etching and 122 indicates a region at which the ONO film 25 is to be unremoved.

In the above example, however, the impurity diffusion layer 27a serving as the source of the word line select transistor 17 and the word line 13 are connected together by the wiring line 35 formed of the metal film 34 and therefore, it is required to form the contact holes 32 and 31 reaching the impurity diffusion layer 27a and the word line 13, respectively, and to connect them by the wiring line 35. Accordingly, as is clear from FIGS. 12 and 13, an area necessary for connection of one of the impurity diffusion layers 27a of the word line select transistor 17 to the word line 13 is increased, making it difficult to provide a minute non-volatile semiconductor memory device.

Further, when forming the contact holes 31 to 33, a method is generally employed in which the inter-layer insulating film 28 is dry-etched using a patterned resist 36 as a mask. However, as the contact hole 31 reaches the word line 13, the word line 13 in a floating state is exposed to charged particles 37 used for the dry-etching so that the charged particles 37 are accumulated on the word line 13.

As a result, a potential difference takes place between the word line 13 and the silicon substrate 21 so that a voltage is applied to the silicon oxide film 29 serving as the tunnel insulating film in the memory cell transistor 12, thus deteriorating the silicon oxide film 29. Accordingly, the aforementioned prior art has difficulties in providing a highly reliable non-volatile semiconductor memory device.

SUMMARY OF THE INVENTION

An object of the present invention is to provide a semiconductor device in which an impurity diffusion layer of a transistor and a different element in the semiconductor device are directly connected by a conductive layer constituting the different element and deterioration of a gate oxide film can be prevented.

Another object of the present invention is to provide a method of making the semiconductor device.

A semiconductor device according to the present invention has a semiconductor substrate, a transistor formed on the semiconductor substrate and including a gate electrode having a first conductive layer and a second conductive layer formed on the first conductive layer and a pair of impurity diffusion layers, and an layers. An electric element including a third conductive layer is formed on the semiconductor substrate and positionally separated from the transistor and a fourth conductive layer formed on the third conductive layer, wherein an insulating layer is provided between the third and fourth conductive layers, the fourth conductive layer extends to be connected directly to one of the paired impurity diffusion layers, the first and third conductive layers are made of the same conductive material and the second and fourth conductive layers are made of the same conductive material.

According to one aspect of the present invention, a non-volatile semiconductor memory device comprises: a semiconductor substrate; a first transistor having a laminated type gate structure formed on a first region of a surface of the semiconductor substrate with a first insulating film interposed therebetween and including a floating gate, a capacitive coupling insulating film and a control gate. A second transistor having a gate electrode is formed on a second region of the surface of the semiconductor substrate and including at least a first conductive film and a pair of impurity diffusion layers, wherein a second conductive layer constituting the control gate of the first transistor extends to be directly connected to one of the paired impurity diffusion layers of the second transistor and the first and second conductive films are made of the same conductive material.

In one embodiment of the present invention, the first transistor is formed in a first element active region surrounded by an element isolation region, the second transistor is formed in a second element active region which is isolated from the first element active region by the element isolation region. The gate electrode of the second transistor includes a third conductive layer on which the first conductive layer is formed, and the second conductive layer constituting the control gate of the first transistor provides a word line and extends over the element isolation region to be connected to one of the paired impurity diffusion layers of the second transistor formed in the second element active region.

In another embodiment of the present invention, the first transistor is formed in a first element active region surrounded by an element isolation region and the second transistor is a thin film transistor formed on an element isolation region. The paired impurity diffusion layers of the second transistor are formed in a conductive layer made of the same material as that of the floating gate of the first transistor, the second conductive layer constituting the control gate of the first transistor provides a word line, and the word line extends over the element isolation region to be connected directly to one of the paired impurity diffusion layers of the second transistor.

A method of making a semiconductor device according to the present invention comprises the steps of: forming a first insulating film on a first region and a second insulating film on a second region of a surface of a semiconductor substrate; forming a first conductive film on the whole surface of the semiconductor substrate; selectively etching the first conductive film and the first insulating film in the first region to expose the surface of the semiconductor substrate at an area where at least impurity diffusion layers are to be formed and selectively etching the first conductive film in the second region to form a predetermined pattern of the first conductive film. The method also comprises the steps of forming a second conductive film on the whole surface of the semiconductor substrate; selectively etching at least the second conductive film in the first region to form a gate electrode of a predetermined pattern including a first layer of the first conductive film and a second layer of the second conductive film, selectively etching the second conductive film in the second region to form an electric element of a predetermined pattern including a third layer of the first conductive film and a fourth layer of the second conductive film such that the fourth layer extends from the second region to reach the first region where it contacts the surface of the semiconductor substrate exposed in the first region; and implanting an impurity into an area of the surface of the semiconductor substrate in the first region where the impurity diffusion layers are to be formed by using the gate electrode as a mask to form a pair of impurity diffusion layers.

A method of making a non-volatile semiconductor memory device according to a first aspect of the present invention comprises the steps of: forming a first insulating film in a first region and a second insulating film in a second region of a surface of a semiconductor substrate; forming a first conductive film on the whole surface of the substrate; removing, in the first region, the first conductive film at an area other than an area where a floating gate of a first transistor is to be formed and removing the first conductive film at a part of the second region to expose the first insulating film; forming a third insulating film on the whole surface of the substrate; removing, in the first region, a portion of the third insulating film other than its portion above the first conductive film remaining in the area where the floating gate is to be formed and removing a part of the first insulating film exposed in the second region thereby to expose the surface of the semiconductor substrate. The method also comprises the steps of forming a second conductive film on the whole surface of the substrate so that the second conductive film directly contacts to the surface of the semiconductor substrate exposed in the second region; and forming a gate electrode of a second transistor in the second region by selectively removing a lamination of the second conductive film and the first conductive film lying thereunder while keeping the direct contact between the surface of the semiconductor substrate and the second conductive film in the second region.

A method of making a non-volatile semiconductor memory device according to a second aspect of the present invention comprises the steps of: forming at least one element active region defined by an element isolation region in a surface of a semiconductor substrate; forming a first insulating film on the element active region; forming a first conductive film on the whole surface of the substrate; removing the first conductive film at an area other than a selected area disposed on the first insulating film in the element active region to be formed with a floating gate of a first transistor and an area in the element isolation region where a gate and a pair of impurity diffusion layers of a second transistor are to be formed; forming a second insulating film above the first conductive film remaining in the element isolation region and the element active region; forming a second conductive film on the whole surface of the substrate such that at least a part of the first conductive film remaining on the element isolation region directly contacts to the second conductive film. The method also comprises the steps of patterning the second conductive film into a shape of a gate electrode of the second transistor in the element isolation region, while keeping the direct contact between at least part of the first conductive film remaining in the element isolation region and the second conductive film and patterning, in the element active region, the second conductive film together with the second insulating film and the first conductive film into a shape of a laminated type gate electrode of the first transistor; and forming a pair of impurity diffusion regions on both sides of the gate electrode of the second transistor by introducing an impurity into the first conductive film in the element isolation region by using the second conductive film patterned into the shape of the gate electrode as a mask.

In the semiconductor device of the present invention, the element isolation region can be utilized efficiently when the word line select transistor (second transistor) is formed as a thin film transistor in the element isolation region, as in one embodiment of the present invention.

In the method of making a non-volatile semiconductor memory device according to the present invention, no contact hole is required to be formed for connection of the word line to the impurity diffusion layers of the word line select transistor (second transistor) and therefore, the word line in a floating state will not be exposed to charged particles used for dry-etching in formation of the contact hole so that the tunnel insulating film will not be deteriorated.

Further, in the method of making a non-volatile semiconductor memory device according to one embodiment of the present invention, the word line is connected to one of the impurity diffusion layers of the word line select transistor through direct contact and therefore, the gate insulating film is removed from an area where the direct contact is to be made, wherein the area where the gate insulating film is removed is included in an area where the capacitive coupling insulating film is to be removed and the gate insulating film has a small thickness.

Thus, by using the mask for removal of the capacitive coupling insulating film as it is, the gate insulating film can be removed sequentially following the removal of the capacitive coupling insulating film. Accordingly, no additional masking or etching step is required for providing the direct contact of the word line to one of the impurity diffusion layers of the word line select transistor.

Further, in the method of making a non-volatile semiconductor memory device according to the second embodiment of the present invention, the word line select transistor is formed as a thin film transistor in an element isolation region, a conductive film in which an impurity diffusion layer of the thin film transistor is to be formed is in a direct contact with the word line to connect the impurity diffused layer of the word line select transistor to the word line, and the impurity diffusion layers, gate insulating film and gate electrode of the thin film transistor are formed of a conductive film used for formation of the floating gate, a capacitive coupling insulating film disposed between the floating gate and the word line and a conductive film used for formation of the word line, respectively, so that the process for formation of the thin film transistor is simplified.

DESCRIPTION OF THE PREFERRED EMBODIMENTS

A first embodiment in which the present invention is applied to an EEPROM will be described with reference to the accompanying drawings.

Figure 1:
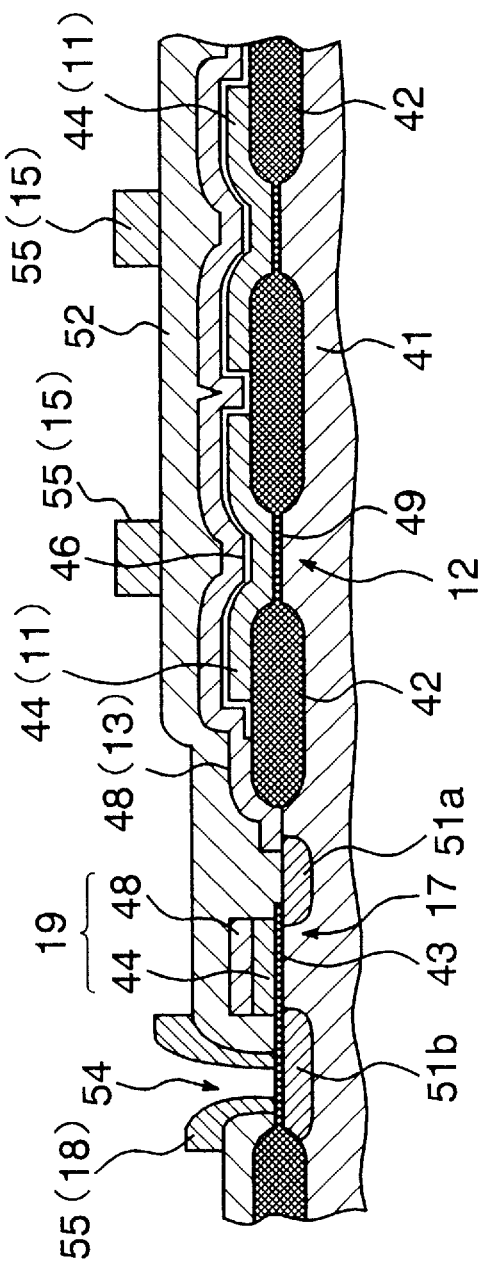
FIG. 1 is a sectional view, taken along I—I of FIG. 2, showing a structure of a non-volatile semiconductor memory device according to a first embodiment of the present invention.
Figure 2:
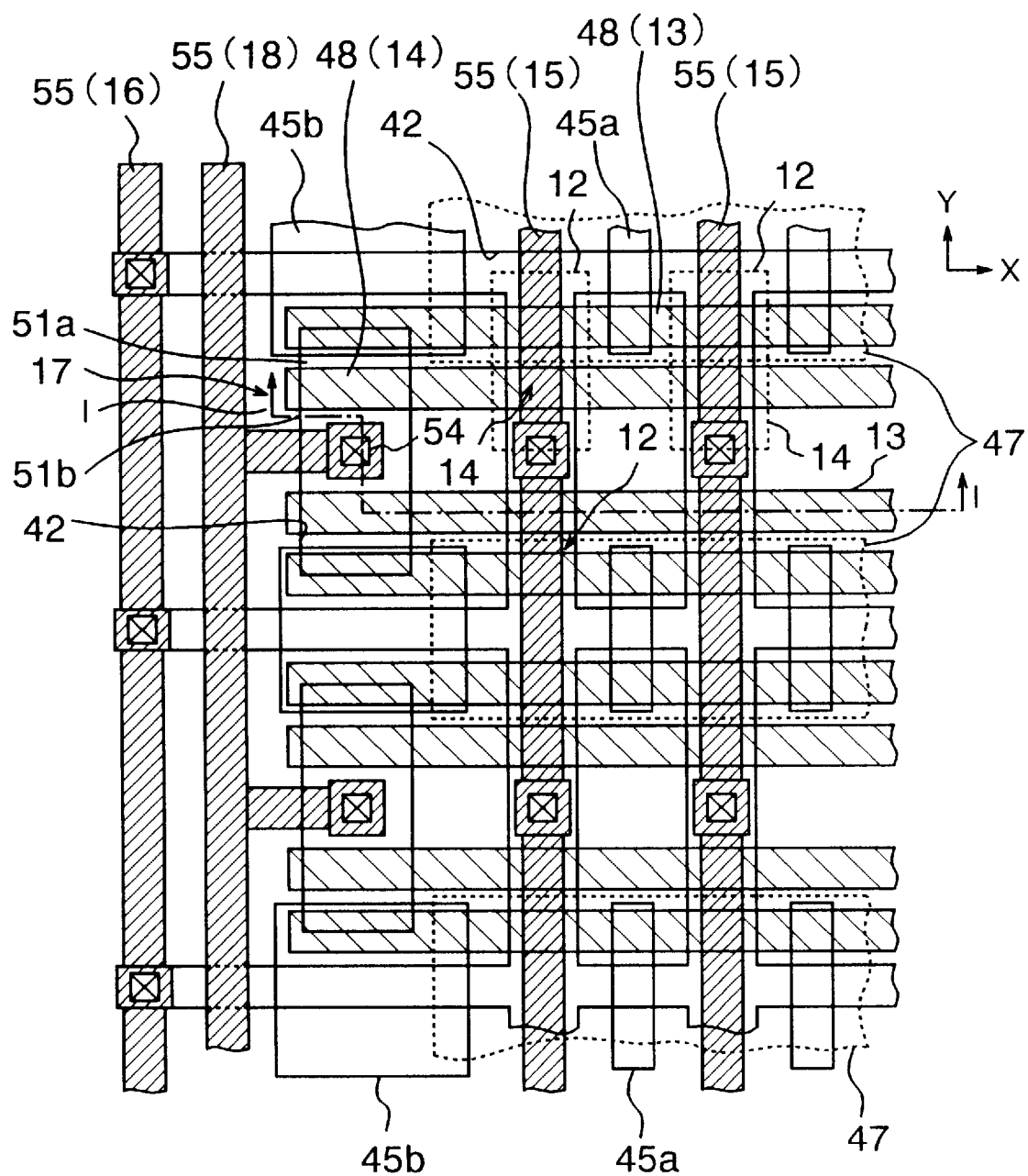
FIG. 2 is a plan view showing a configuration of the non-volatile semiconductor memory device of FIG. 1.

FIGS. 1 and 2 show a structure of a memory cell portion in a non-volatile semiconductor memory device of the present embodiment. An equivalent circuit of the non-volatile semiconductor memory device of the present embodiment is substantially the same as that shown in FIG. 11 with the exception that the contact holes 31 and 32 and the wiring line 35 are not provided. FIG. 1 is a sectional view taken along a line (I–I' in FIG. 2) which extends from a portion of the select line 18 connected to a drain of a transistor 17 for word line select along a word line 13 in a plan view of FIG. 2.

In the present embodiment, an element isolation region is defined by a silicon oxide film 42 selectively formed on the surface of a silicon substrate 41. A silicon oxide film 43 serving as a gate insulating film of the word line select transistor 17 and a silicon oxide film 49 serving as a tunnel insulating film of a memory cell transistor 12 are formed on the respective surfaces of element active regions surrounded by the silicon oxide film 42. A gate electrode of the word line select transistor 17 is integrally connected to a gate electrode of a memory cell select transistor 14 by a select gate line 19.

A floating gate 11 and a lower layer of the select gate line 19 are formed of a first layer 44 of polycrystalline silicon film on the silicon substrate 41 and a capacitive coupling insulating film of the memory cell transistor 12 is formed of an ONO film 46 (silicon oxide film/silicon nitride film/silicon oxide film) covering the floating gate 11. The word line 13 and an upper layer of the select gate line 19 are formed of a second layer 48 of polycrystalline silicon film on the silicon substrate 41.

In the element active region, impurity diffusion layers 51a and 51b serving as source and drain of the word line select transistor 17 and impurity diffusion layers (not shown) serving as sources and drains of the memory cell transistor 12 and the memory cell select transistor 14 are formed on both sides of the polycrystalline silicon films 44 and 48. The word line 13 and the select gate line 19 are covered with an inter-layer insulating film 52 and a contact hole reaching the impurity diffusion layer 51b is formed in the inter-layer insulating film 52.

The select line 18 connected to the impurity diffusion layer 51b through the contact hole 54, a bit line 15 and a source line 16 are formed of a metal film 55.

In the first embodiment, the memory cells are arranged in a plurality of lines extending parallelly in an X-direction and each memory cell includes the memory cell transistor 12 and the memory cell select transistor 14. The word line 13 (48 (19) in FIG. 2) and the select gate line 19 (48(14) in FIG. 2) adjacent thereto are provided to the memory cells arranged in each line, the word line 13 is connected to a control gate of the associated memory cell transistor 12 and the select gate line 19 is connected to a gate electrode of the associated memory cell select transistor 14.

The word line select transistors 17 are provided in correspondence to the respective word lines and arranged in a line extending in a Y-direction which intersects the X-direction, preferably, at a right angle. One of the paired impurity diffusion layers of each word line select transistor 17 is on an extension of the corresponding word line so that the word line is connected directly to the one impurity diffusion layer. The gate electrode of the transistor 17 is on an extension of the select gate line 19 adjacent to the word line so that the select gate line 19 is connected directly to the gate electrode of the transistor 17.

Figure 11:
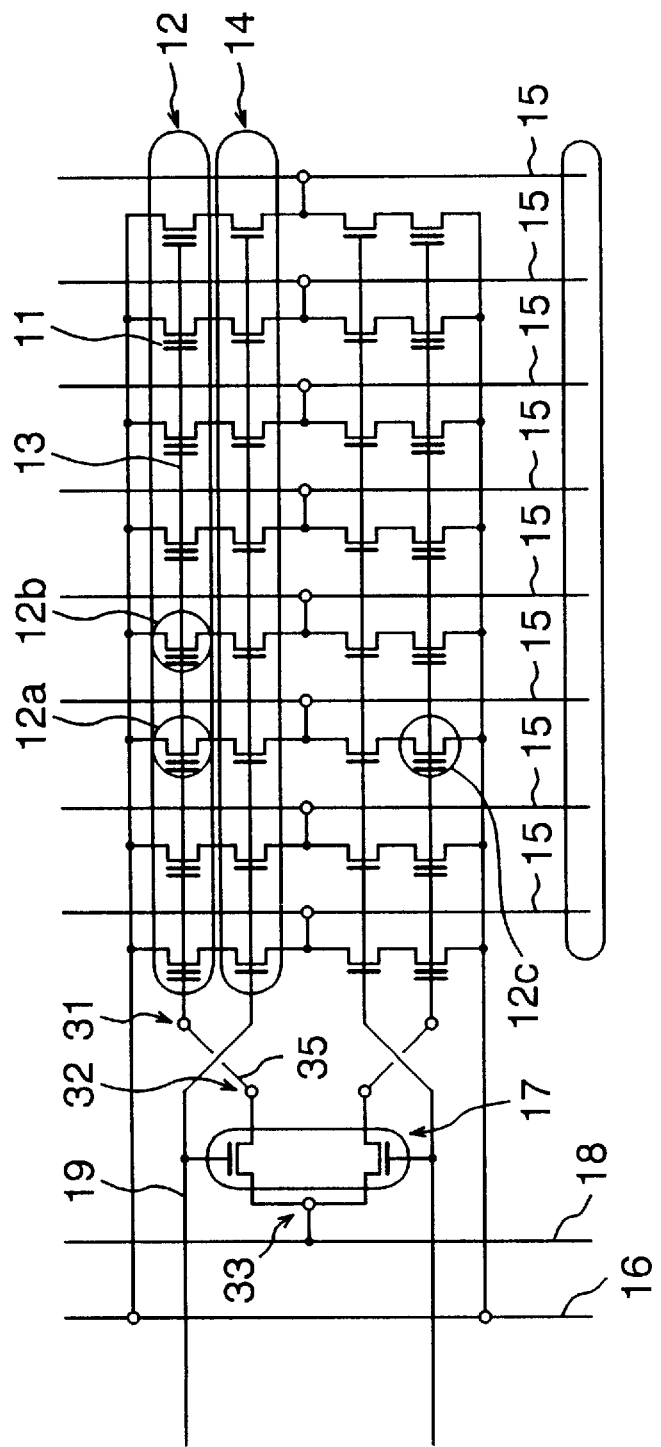
FIG. 11 is an equivalent circuit diagram of a conventional non-volatile semiconductor memory device.
Figure 12:
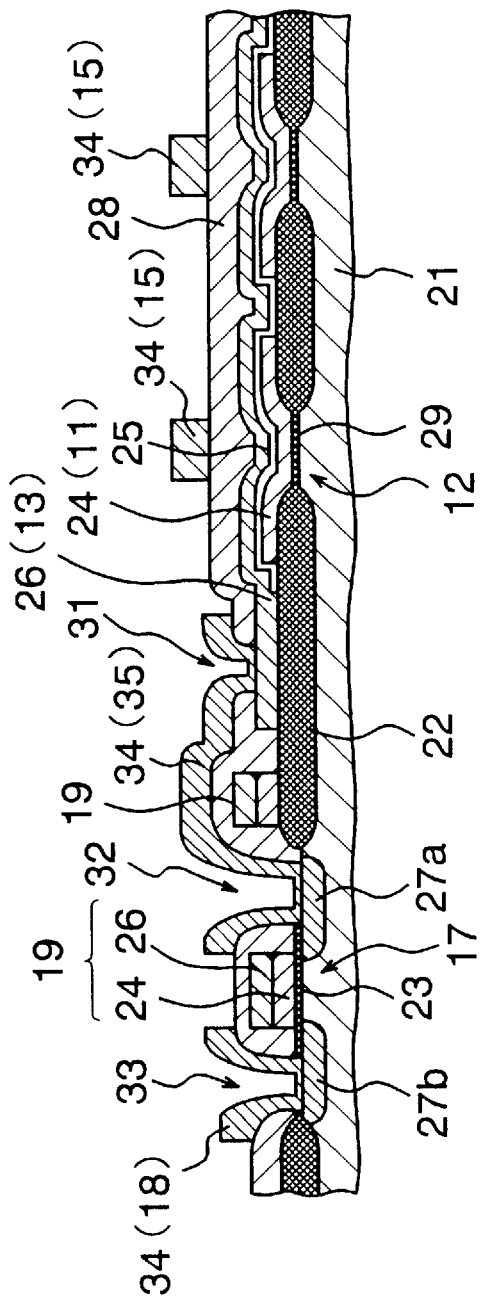
FIG. 12 is a sectional view, taken along XII—XII of FIG. 11, showing a structure of the conventional non-volatile semiconductor memory device.
Figure 13:
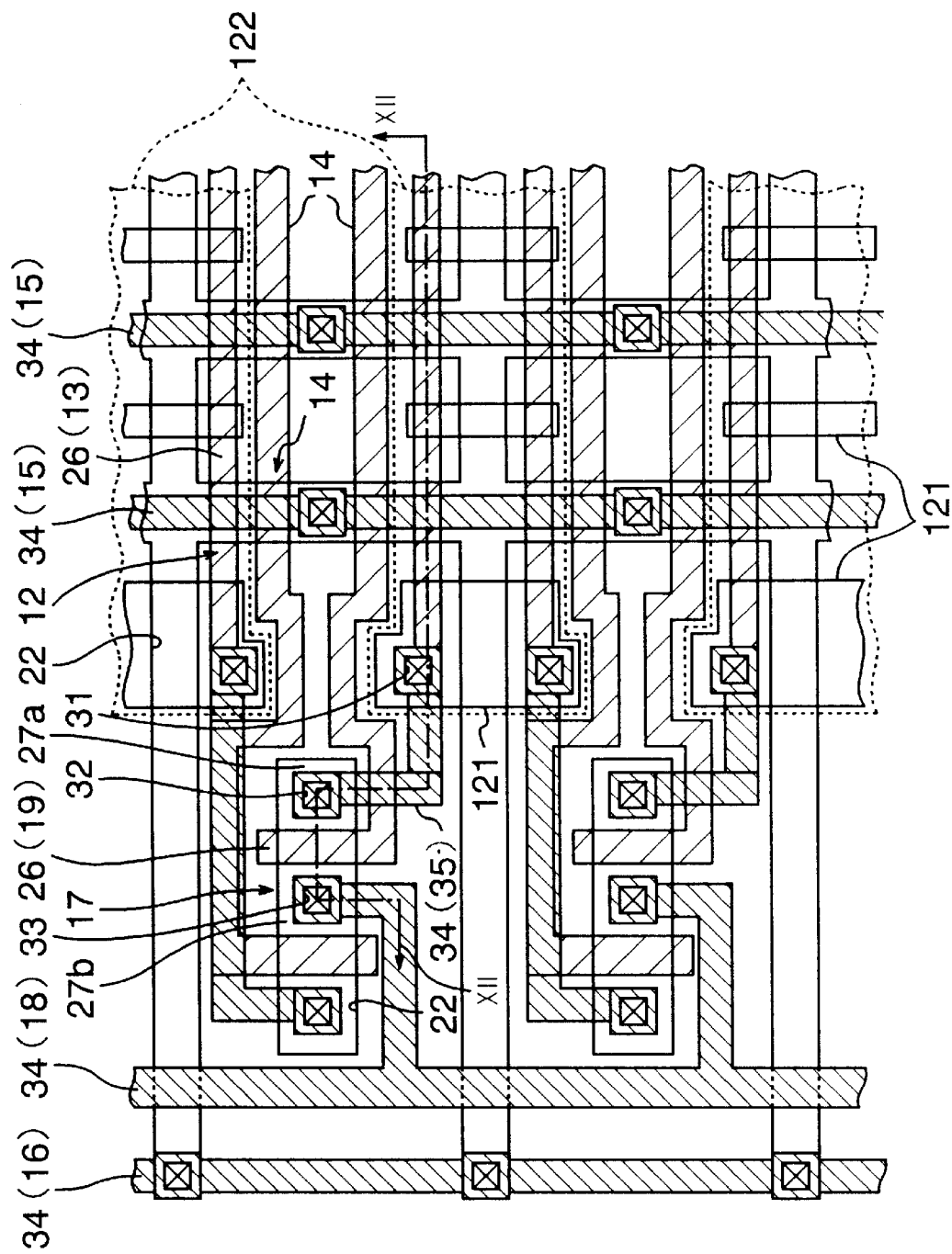
FIG. 13 is a plan view showing a configuration of the non-volatile semiconductor memory device of FIG. 12.
Figure 14:
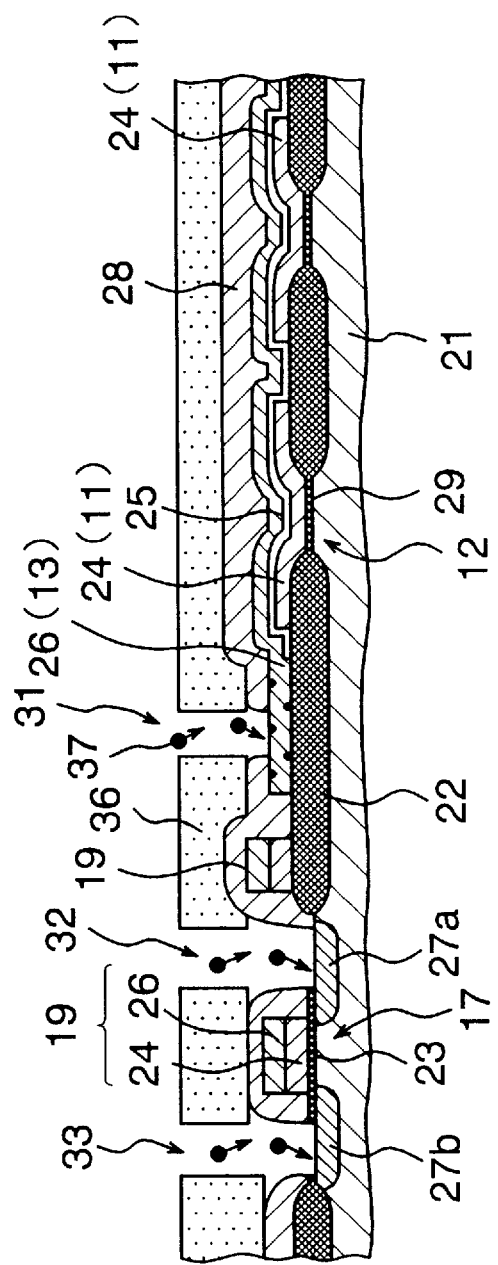
FIG. 14 is a sectional view for explaining problems raised by the conventional non-volatile semiconductor memory device.

With this arrangement, in the non-volatile semiconductor memory device of the present embodiment, the word line 13 need not be connected to the impurity diffusion layer 51a through the contact hole by means of the crossover line 35 like the conventional device shown in FIGS. 11 to 13 and therefore, the overall area of the device can be reduced by at least an area required for formation of the contact hole.

Referring now to FIGS. 3A to 3G, a method of making the non-volatile semiconductor memory device of the present embodiment will be described.

Figure 3A:
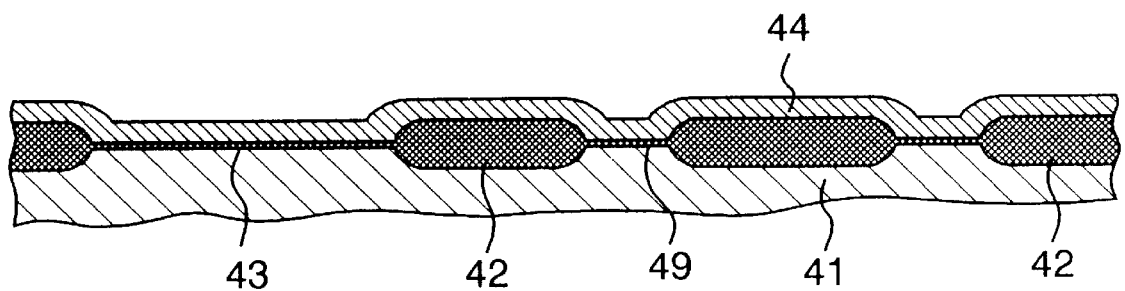
FIGS. 3A to 3G are sectional views corresponding to FIG. 1 in the respective steps of a method of making the non-volatile semiconductor memory device according to the first embodiment of the present invention.

In order to make the non-volatile semiconductor memory device of the present embodiment, a silicon oxide film 42 serving as a field oxide film of about 600 nm thickness is first formed selectively on the surface of a silicon substrate 41 through LOCOS process to define an element isolation region, as shown in FIG. 3A.

Thereafter, a silicon oxide film 43 of about 30 nm thickness serving as the gate insulating film of the word line select transistor 17 and a silicon oxide film 49 of about 10 nm thickness serving as the tunnel insulating film of the memory cell transistor 12 are formed by thermal oxidation on the respective surfaces of element active regions surrounded by the silicon oxide film 42. Thereafter, a first layer of polycrystalline silicon film 44 is deposited on the whole surface at a thickness of about 150 nm and an impurity such as phosphorous is ion-implanted into the polycrystalline silicon film 44 at a dose rate of about $1 \times 10^{15} cm^{-2}$.

Figure 3B:
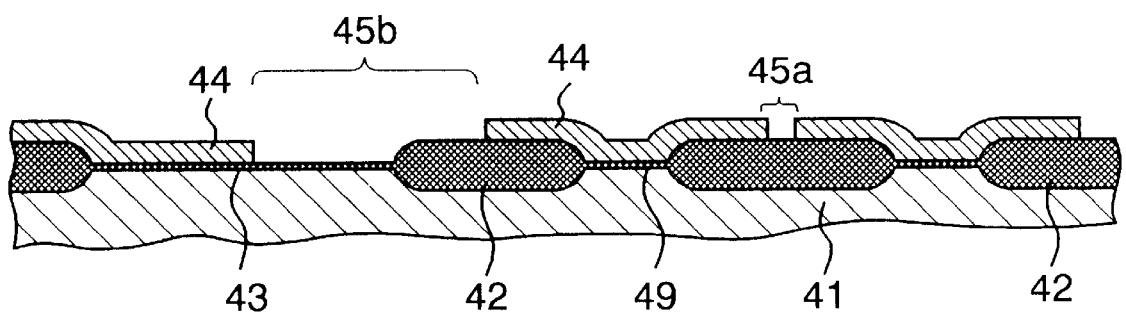

Next, as shown in FIG. 3B, the polycrystalline silicon film 44 is removed at a region 45a (see FIG. 2) disposed between two floating gates 11 which are adjacent in the X-direction in which the word line 13 extends and at a region 45b (see FIG. 2) corresponding to a part of the element active region in which the word line select transistor 17 is to be formed and its neighborhood.

Figure 3C:
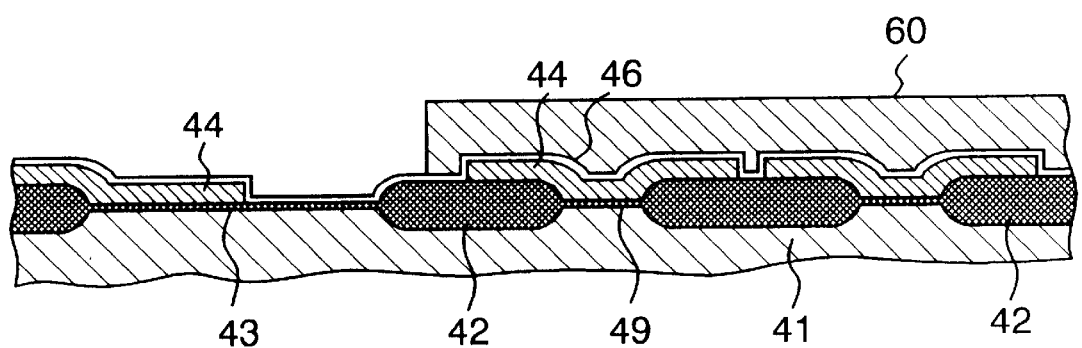

Subsequently, as shown in FIG. 3C, an ONO film 46 acting as the capacitive coupling insulating film of the memory cell transistor 12 is formed on the whole surface at a thickness of about 30 nm as converted to an equivalent thickness of the silicon oxide film.

Figure 3D:
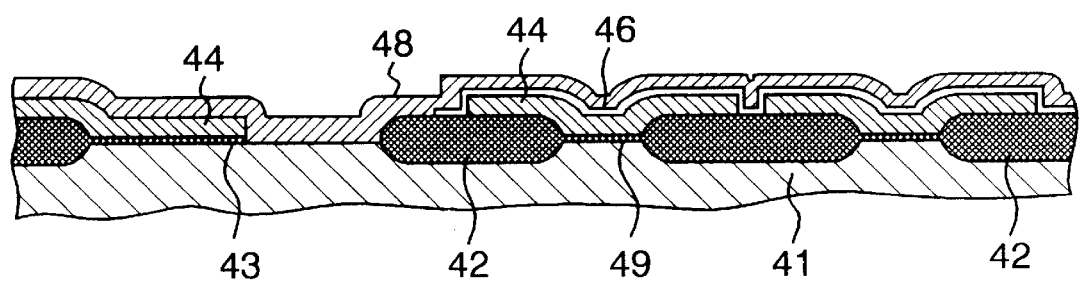

Subsequently, as shown in FIG. 3D, the ONO film 46 is removed from an area other than an area 47 (see FIG. 2) in which the floating gate 11 is to be formed by using a resist designated by 60 in FIG. 3C as a mask and the silicon oxide film 43 is removed from an area other than the area 47 and uncovered with the polycrystalline silicon film 44 (an area indicated by 45 in FIG. 2) to expose the silicon substrate 41 at this area.

Thereafter, a second layer of polycrystalline silicon film 48 is deposited on the whole surface at a thickness of about 150 nm. At that time, the polycrystalline silicon film 48 directly contacts the silicon substrate 41 exposed in the element active region where the word line select transistor 17 is to be formed.

Figure 3E:
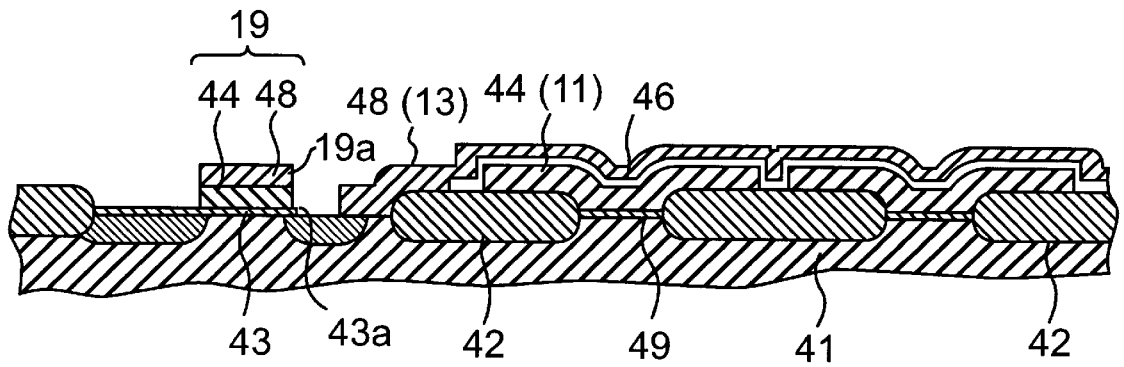

Next, as shown in FIG. 3E, in the region in which the memory cell array is formed, the polycrystalline silicon film 48 and the ONO film 46 are first patterned to a shape of the word line and then the polycrystalline silicon film 44 is patterned to a shape of the floating gate 11. Subsequently, in the element active region in which the word line select transistor is to be formed, the polycrystalline silicon films 48 and 44 are patterned to a shape of the select gate 19 serving as the gate electrode of the word line select transistor.

At that time, a portion of the polycrystalline silicon film 48 patterned to the shape of the word line, which directly contacts the silicon substrate exposed in the element active region where the word line select transistor is to be formed, is kept unremoved. By this process, the floating gates 13 are formed of the polycrystalline silicon film 44, the word lines 13 are formed of the polycrystalline silicon film 48 and the select gate line 19 is formed of a lamination of the polycrystalline silicon films 44 and 48.

By leaving a margin between an edge 19a of the select gate line 19 and an edge 43a of the silicon oxide film 43 in the element active region, the silicon oxide film 43 includes a portion which is not covered with the select gate 19 as shown in FIG. 3E, so that the silicon substrate 41 will not suffer from crystal defects due to etching at an area beneath the side of the select electrode 19 and the reliability of the word line select transistor 17 can be improved.

Figure 3F:
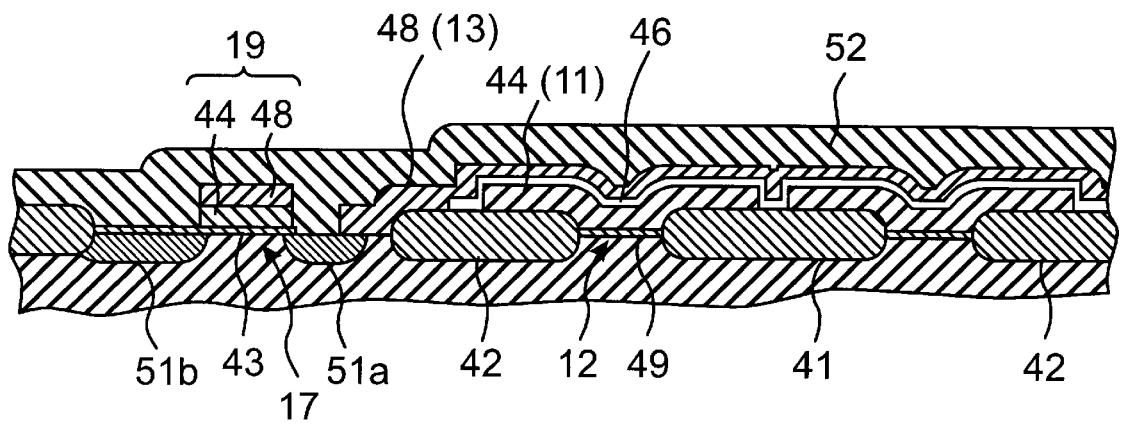

Next, as shown in FIG. 3F, by using the polycrystalline silicon film 48 and silicon oxide film 43 as a mask, an impurity such as arsenic is ion-implanted into the silicon substrate 41 at a dose rate of about $1 \times 10^{15} cm^{-2}$ and then a thermal treatment is carried out. As a result, in the element active region, impurity diffusion layers 51a and 51b serving as the source and drain of each word line select transistor 17 and impurity diffusion layers (not shown) serving as the sources and drains of the memory cell transistor 12 and memory cell select transistor 14 are formed on both sides of the polycrystalline silicon films 44 and 48.

At that time, the impurity ion-implanted into the silicon substrate 41 is thermally diffused in the lateral direction and consequently, the impurity diffusion layer 51a extends to underside the word line 13 so that the word line 13 of the memory cell transistor 12 overlaps the impurity diffusion layer 51a. As a result, the word line 13 directly contacts the impurity diffusion layer 51a so as to provide an electrical connection between them. Thereafter, an inter-layer insulating film 52 is formed on the whole surface.

Figure 3G:
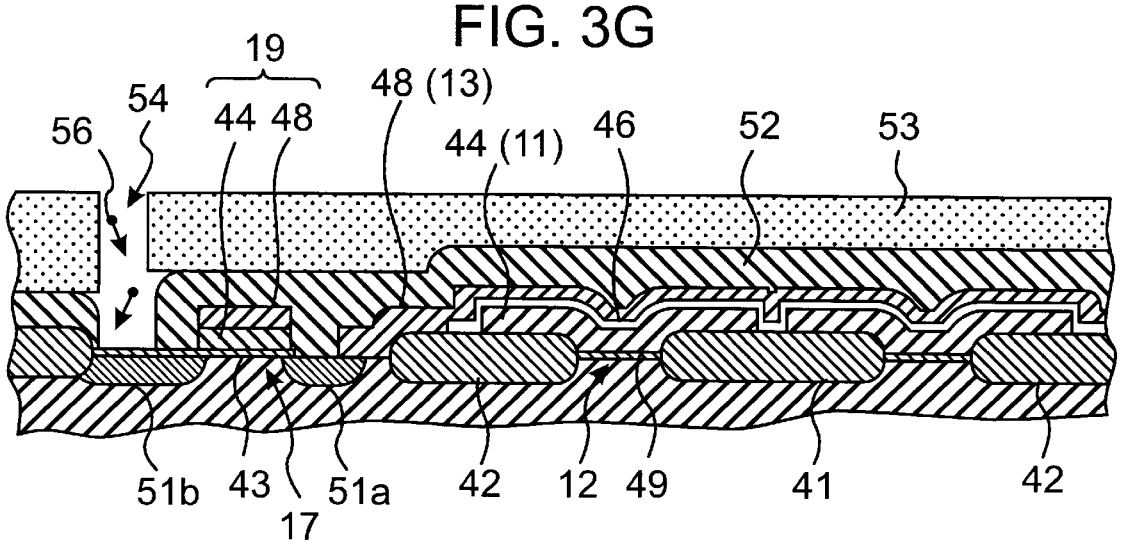

Subsequently, as shown in FIG. 3G, a dry-etching is applied to the inter-layer insulating film 52 by using a patterned photoresist 53 as a mask to form a contact hole 54 which reaches the impurity diffusion layer 51b. Thereafter, through the step of forming the select line 18 connected to the impurity diffusion layer 51b through the contact hole 54, the bit line 15 and the source line 16 by using a metal film 55, the non-volatile semiconductor memory device as shown in FIG. 1 can be obtained.

Since in the present embodiment as made in the above-mentioned manner, the impurity diffusion layer 51a serving as the source of the word line select transistor 17 is connected to the word line 13 by direct contact, it is not required to form any contact hole through which the impurity diffusion layer 51a and the word line 13 are connected to each other by a crossover line of metal film 55 in any of the impurity diffusion layer 51a and word line 13. Accordingly, as is clear from FIGS. 1 and 2, the area necessary for formation of each of the word line select transistor 17 and the word line 13 can be reduced by at least an area necessary for formation of the contact hole.

Since the contact hole is not formed for the word line 13, the word line 13 in a floating state is not exposed to charged particles 56 used in dry-etching for forming the contact hole as seen from FIG. 3G and deterioration of the silicon oxide film 43 serving as the tunnel insulating film of the memory cell transistor 12 can be prevented.

Further, in the present embodiment, the thin silicon oxide film 43 is removed in the step of FIG. 3D for connecting the word line 13 to the impurity diffusion layer 51a of the word line select transistor 17 by direct contact. However, an area, where the gate insulating film 43 is removed, is included in an area where the ONO film 46 is removed. Accordingly, by using the mask 60 employed for removal of the ONO film 46 and the polycrystalline silicon film 44 as a mask, the silicon oxide film 43 can be removed in sequence after removal of the ONO film 46. Therefore, no addition of masking or etching steps is required for achieving direct contact of the word line 13 to the impurity diffusion layer 51a of the word line select transistor 17.

While in the present embodiment the select electrode 19 serving as the gate electrode of the word line select transistor 17 is formed of a double-layer structure of polycrystalline silicon films 44 and 48, the select gate 19 may be formed of only one of these films.

Figure 4:
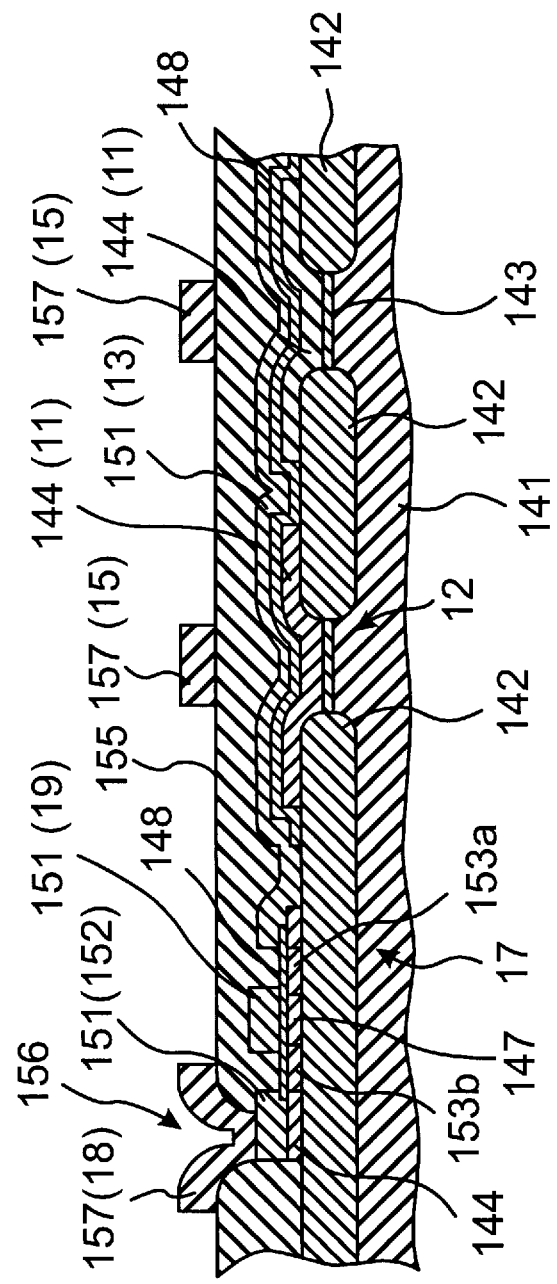
FIG. 4 is a sectional view, taken along IV—IV of FIG. 5, showing a structure of a non-volatile semiconductor memory device according to a second embodiment of the present invention.
Figure 5:
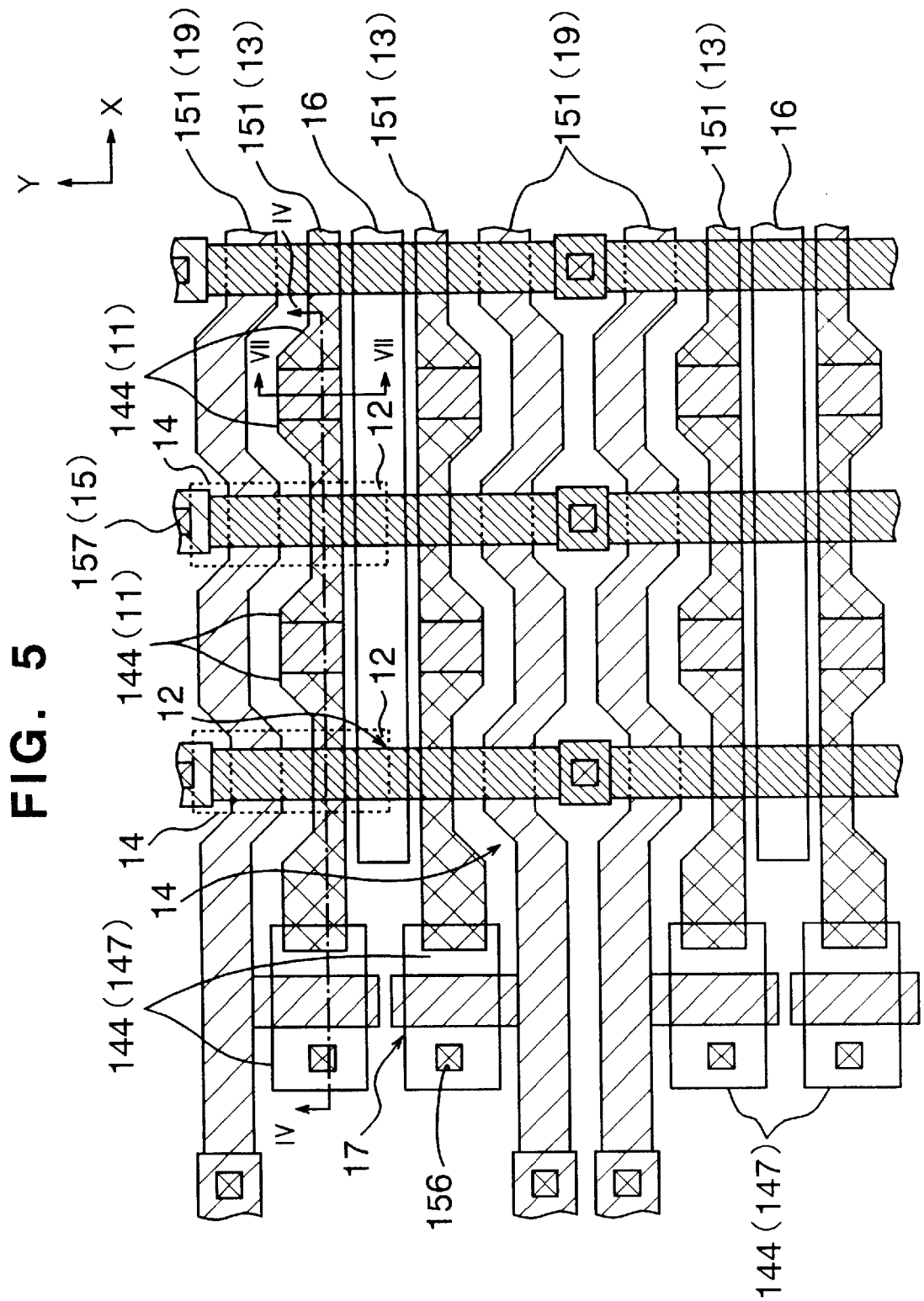

Referring now to FIGS. 4 and 5, a second embodiment of the present invention will be described.

FIGS. 4 and 5 show a structure of a memory cell portion in a non-volatile semiconductor memory device of the present embodiment. An equivalent circuit of the non-volatile semiconductor memory device of the present embodiment is substantially the same as that shown in FIG. 11 with the exception that the contact holes 31 and 32 and the wiring line 35 are not provided. FIG. 4 is a sectional view along IV—IV in a plan view of FIG. 5.

In the present embodiment, an element isolation region is defined by a silicon oxide film 142 selectively formed on the surface of a silicon substrate 141, and a silicon oxide film 143 serving as a tunnel insulating film of a memory cell transistor 12 is formed on the surface of an element active region surrounded by the silicon oxide film 142. A word line select transistor 17 is formed on the silicon oxide film 142, and its gate electrode is formed integrally with a select gate line 19 serving as a gate electrode of a memory cell select transistor 14.

A floating gate 11 is formed of a first layer of polycrystalline silicon film 144 on the silicon substrate 141, and the polycrystalline silicon film 144 extends also to a region on the silicon oxide film 142 in which the word line select transistor 17 is formed, so that a part of the polycrystalline silicon film provides an active layer 147 of the word line select transistor 17. A capacitive coupling insulating film of the memory cell transistor 12 which covers its floating gate 11 and a gate insulating film of the word line select transistor 17 are formed of an ONO film (silicon oxide film/silicon nitride film/silicon oxide film) 148. A word line 13 and the select gate line 19 are formed of a second layer of polycrystalline silicon film 151 on the silicon substrate 141.

In the element active region, impurity diffusion layers (not shown) serving as sources and drains of the memory cell transistor 12 and the select transistor 14 are formed on both sides of the polycrystalline silicon films 144 and 151. In the polycrystalline silicon film 144, impurity diffusion layers 153a and 153b serving as a source and a drain of the word line select transistor 17 are formed on both sides of the select gate line 19 serving as the gate electrode of the word line select transistor 17. The word line 13 and the select gate line 19 are covered with an inter-layer insulating film 155 and a contact hole 156 reaching a pad layer 152 formed of the polycrystalline silicon film 151 is formed in the inter-layer insulating film 155. The pad layer 152 is connected to the impurity diffusion layer 153b via the polycrystalline silicon film 144.

The select line 18 connected to the impurity diffusion layer 153b through the contact hole 156 and the bit line 15 are formed of a metal film 157. The sources of the memory cell transistors 12 are formed in a continuous layer serving as a source line 16 extending on a surface portion of silicon substrate 141 disposed between word lines 13 which are adjacent to each other in a direction in which the bit line 15 extends.

In the present embodiment, too, the memory cells are arranged on a plurality of lines extending parallelly in an X-direction and each memory cell includes the memory cell transistor 12 and the memory cell select transistor 14. The word line 13 (151(13) in FIG. 5) and the select gate line (151(19) in FIG. 5) adjacent thereto are provided to the memory cells arranged on each line such that the word line 13 is connected to the control gates of associated memory cell transistors 12 and the select gate line 19 is connected to a gate electrode of the associated memory cell select transistor 14.

The word line select transistors 17 provided in correspondence to the respective word lines are arranged in a line extending in the Y-direction which intersects the X-direction at, preferably, a right angle. One of the paired impurity diffusion layers of each word line select transistor 17 is on an extension of the corresponding word line so that the word line is connected directly to the one impurity diffusion layer. The gate electrode of the transistor 17 is connected directly to an extension of the select gate line 19 adjacent to the word line.

With the above arrangement, in the non-volatile semiconductor memory device of the present embodiment, the word line 13 need not be connected to the impurity diffusion layer 51*a* through the contact hole by means of the crossover line 35 like the conventional device shown in FIGS. 11 to 13 and therefore, the overall area of the device can be reduced by at least an area required for formation of the contact hole. In addition, in the present embodiment, the word line select transistor 17 is formed in an element isolation region to utilize the element isolation region efficiently and therefore, the area of the overall device can be reduced.

Figure 6A:
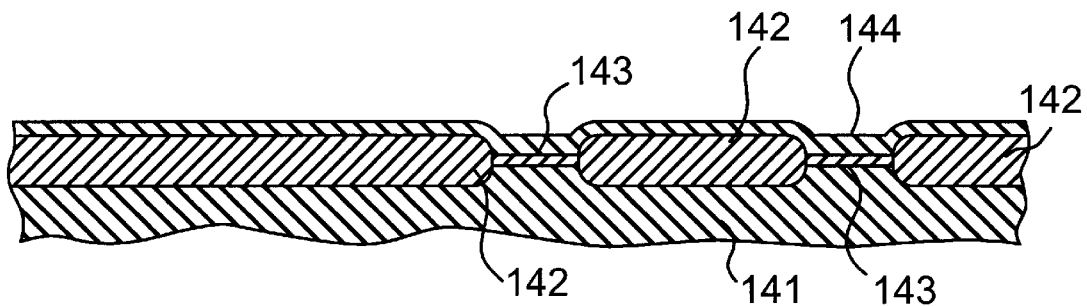
FIGS. 6A to 6J are sectional views corresponding to FIG. 4 in the respective steps of a method of making the non-volatile semiconductor memory device according to the second embodiment of the present invention.
Figure 6B:
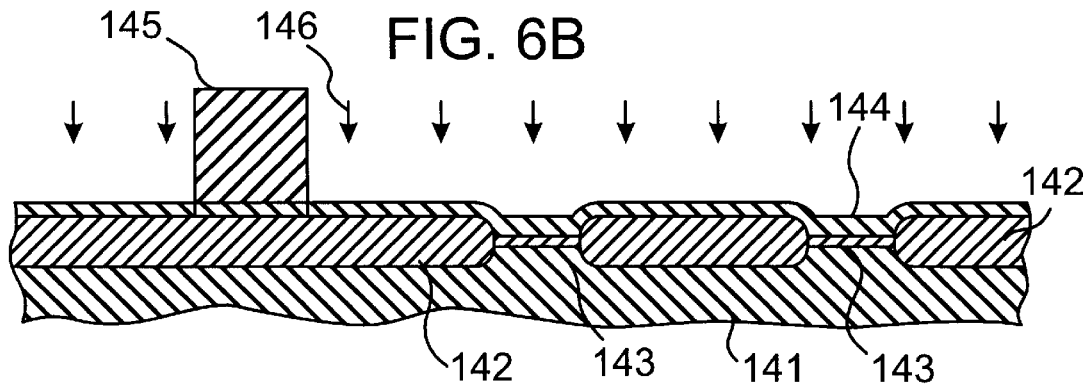
Figure 6C:
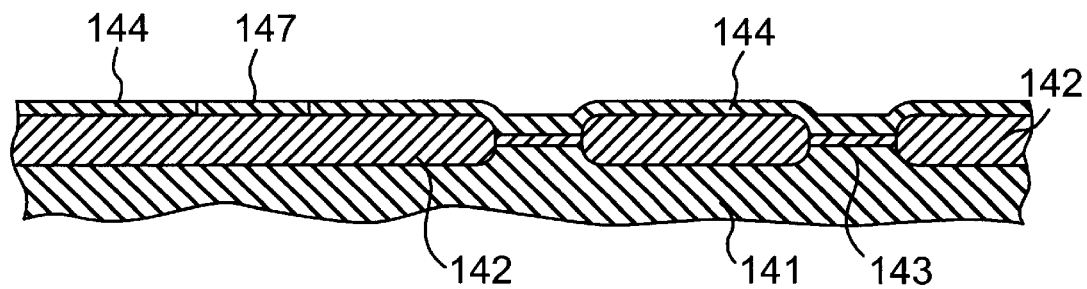
Figure 6D:
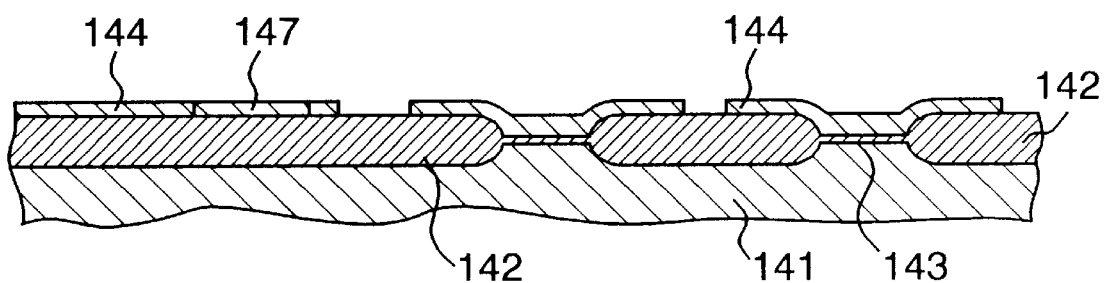
Figure 6E:
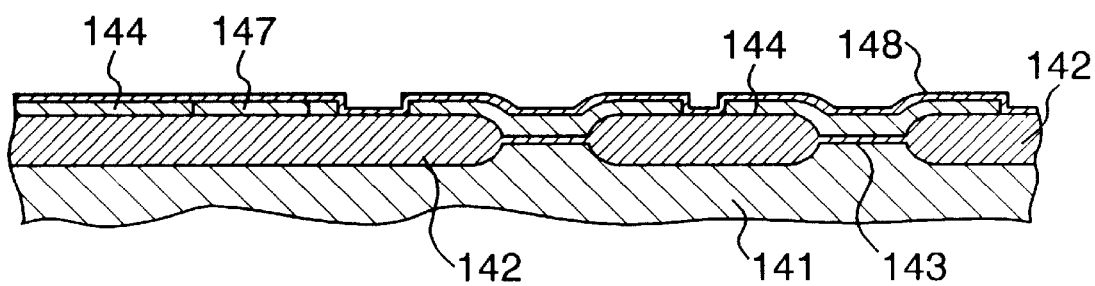
Figure 6F:
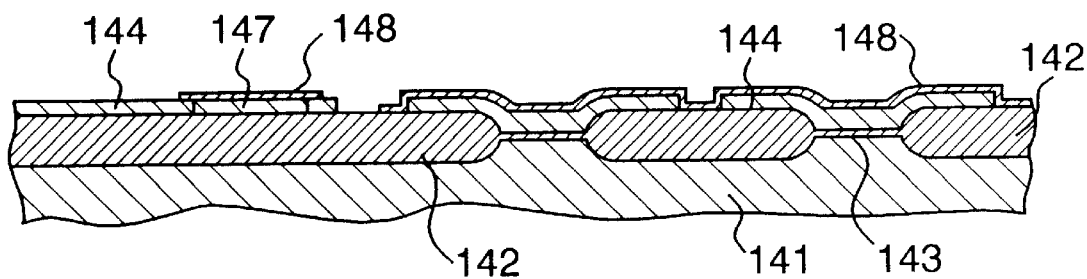
Figure 6G:
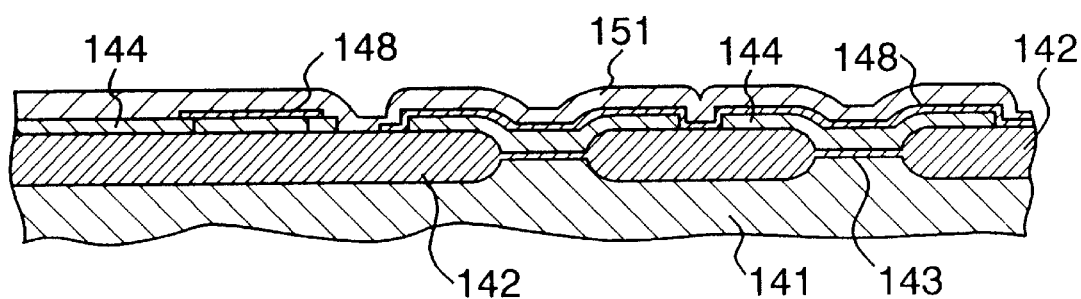
Figure 6H:
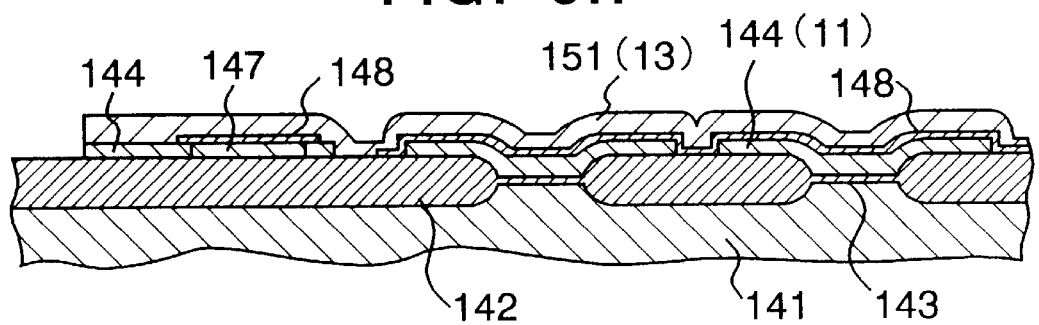
Figure 6I:
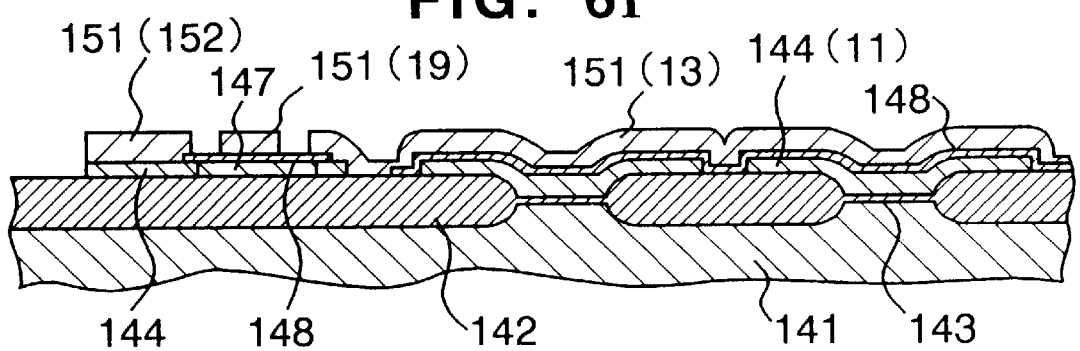
Figure 6J:
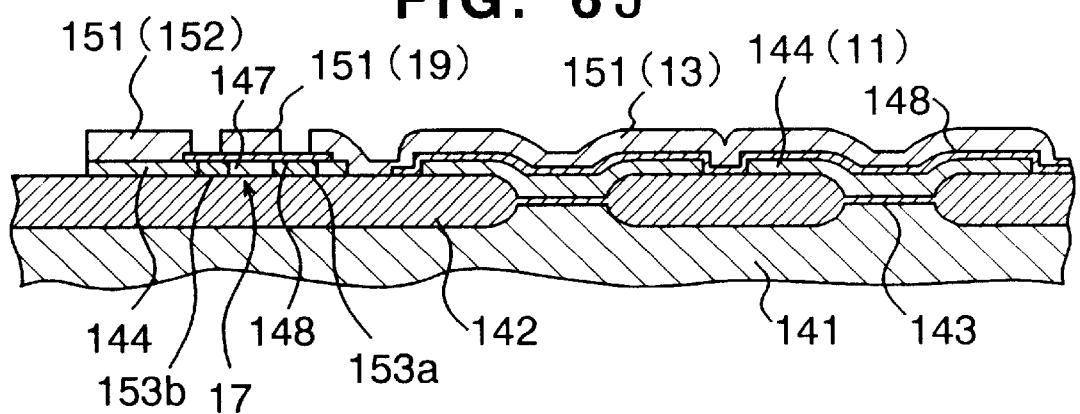
Figure 7A:
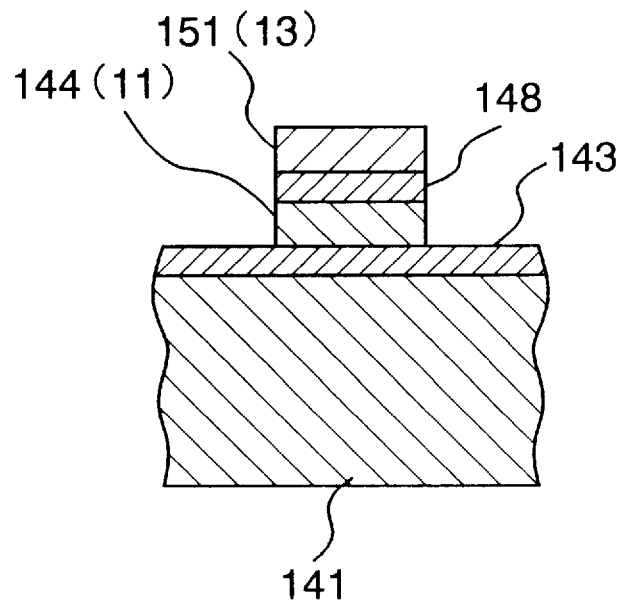
FIGS. 7A and 7B are sectional views taken along VII—VII of FIG. 5 in the steps of FIGS. 6H and 6J of the method of making the non-volatile semiconductor memory device according to the second embodiment of the present invention.
Figure 7B:
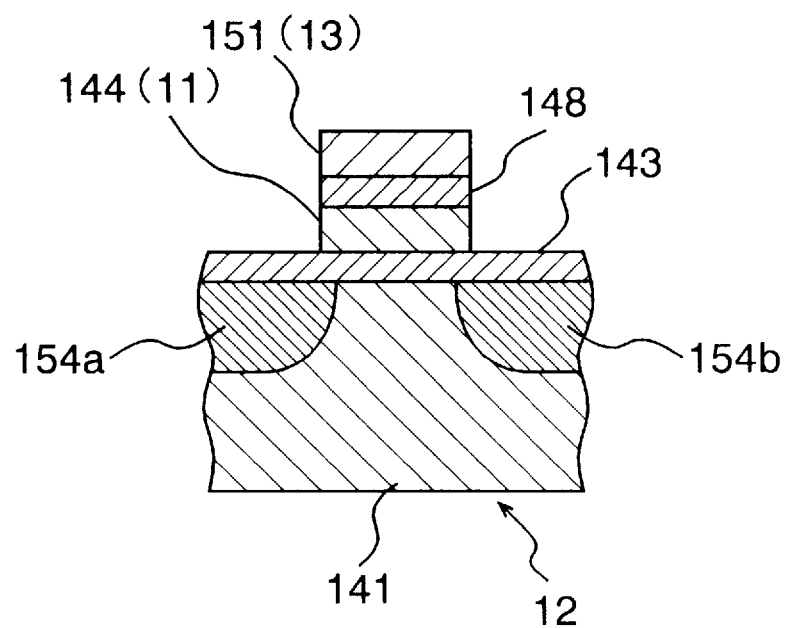

Referring now to FIGS. 6A to 6J, 7A and 7B, a method of making the non-volatile semiconductor memory device of the present embodiment will be described. FIGS. 6A and 6B are sectional views along VI—VI of FIG. 5 and FIGS. 7A and 7B are sectional views along VII—VII of FIG. 5.

In making the non-volatile semiconductor memory device of the present embodiment, a silicon oxide film 142 serving as a field oxide film of about 600 nm thickness is first formed selectively on the surface of a silicon substrate 141 through LOCOS process to define an element isolation region, as shown in FIG. 6A.

Thereafter, a silicon oxide film 143 of about 10 nm serving as the tunnel insulating film of the memory cell transistor 12 is formed on the surface of an element active region surrounded by the silicon oxide film 142. Thereafter, a first layer of polycrystalline silicon film 144 is deposited on the whole surface at a thickness of about 150 nm.

Next, as shown in FIG. 6B, a resist 145 is formed to cover a portion of polycrystalline silicon film 144 at which a thin film transistor serving as the word line select transistor 17 is to be formed and by using the resist 145 as a mask, an impurity 146 such as phosphorous is ion-implanted into the polycrystalline silicon film 144 at a dose rate of about $1 \times 10^5 \text{cm}^{-2}$.

Next, as shown in FIG. 6C, the resist 145 is peeled off for removal. Through this, an active layer 147 for the word line select transistor 17 is formed at an area of the polycrystalline silicon film 144 which has been covered with the resist 145.

Subsequently, as shown in FIG. 6D, the polycrystalline silicon film 144 is removed from an area disposed between two floating gates 11 which are adjacent to each other in the direction in which the word line 13 extends and in the element isolation region, a part of the polycrystalline silicon film 144 disposed close to the active layer 147 is removed.

Subsequently, as shown in FIG. 6E, an ONO film 148 serving as the capacitive coupling insulating film of the memory cell transistor 12 is formed on the whole surface at a thickness of about 30 nm as converted to an equivalent thickness of the silicon oxide film.

Subsequently, as shown in FIG. 6F, the ONO film 148 is removed at an area other than an area at which transistors of peripheral circuits are to be formed and an area (above the active layer 147) which has been covered with the resist 145 in the region where the word line select transistor 17 is to be formed. Then, the ONO film 148 remaining in the region where the word line select transistor 17 is to be formed is used as the gate insulating film of the word line select transistor 17. Alternatively, the ONO film 148 in the region where the word line select transistor 17 is removed totally and a gate insulating film is newly formed on the active layer 147.

Next, as shown in FIG. 6G, a second layer of polycrystalline silicon film 151 is deposited on the whole surface at a thickness of about 150 nm. In this case, the polycrystalline silicon film 144 directly contacts the polycrystalline silicon film 151 at an area of the element isolation region where the polycrystalline silicon film 144 has been partly removed.

Subsequently, as shown in FIGS. 6H and 7A, the polycrystalline silicon film 151, ONO film 148 and polycrystalline silicon film 144 at an area where the word line 13 is to be formed are worked by etching into a pattern of the word line 13 and the floating gate 11 and the polycrystalline silicon films 151 and 144 are worked by etching into a predetermined pattern in the region where the word line select transistor 17 is to be formed.

As a result, the floating gate 11 is formed of the polycrystalline silicon film 144 and the word line 13 is formed of the polycrystalline silicon film 151. Depending on a structure of the memory cell transistor 12, however, it is not always necessary to sequentially etch the polycrystalline silicon film 151, ONO film 148 and polycrystalline silicon film 144.

In performing the above etching work, patterning is effected in such a manner that a portion of the word line 13, which contacts the polycrystalline silicon film 144 on the silicon oxide film 142, is kept unremoved. Accordingly, by the direct contact of the word line 13 to the polycrystalline silicon film 144 remaining in the element isolation region, these elements are connected electrically to each other.

Next, as shown in FIG. 6I, the polycrystalline silicon film 151 at an area where the select gate line 19 is to be formed is formed by etching into a pattern of the select gate line 19. As a result, a pad layer 152 of the word line select transistor 17 and the select gate line 19 are formed of the polycrystalline silicon film 151.

Next, by using the polycrystalline silicon film 151 and the silicon oxide film 142 as a mask, an impurity such as arsenic is ion-implanted into the polycrystalline silicon film 144 and the silicon substrate 141 at a dose rate of about $1 \times 10^{15} \text{cm}^{-2}$.

Consequently, as shown in FIG. 6J, impurity diffusion layers 153*a* and 153*b* serving as parts of the source and the drain of the word line select transistor 17 are formed at portions of the active layer 147 of the polycrystalline silicon film 144 which are disposed at both sides of the select gate 19 and have not been ion-implanted with the impurity 146. Further, as shown in FIG. 7B, impurity diffusion layers 154*a* and 154*b* serving as the source and drain of the memory cell transistor 12 (or the memory cell select transistor 14) are formed at portions of an element active region of silicon substrate 141 which are on both sides of each of the word line 13 and the select gate 19.

Subsequently, an inter-layer insulating film 155 is formed on the whole surface and a dry-etching is performed by using a patterned resist (not shown) as a mask on the inter-layer insulating film 155 to form a contact hole 156 reaching the pad layer 152. Then, the select line 18 connected to the pad layer 152 through the contact hole 156 and the bit line 15 are formed of a metal film 157, so that the non-volatile semiconductor memory device as shown in FIG. 4 can be obtained.

In the present embodiment as made in the above-mentioned manner, since the word line 13 is connected by direct contact to a part of the polycrystalline silicon film 144 where the impurity diffusion layer 153*a* of the word line select transistor 17, is formed no contact hole is provided for the impurity diffusion layer 153a and the word line 13 for connecting the impurity diffusion layer 153a to the word line 13 through a metal film 157. Accordingly, as seen from FIGS. 4 and 5, the area necessary for the word line select transistor 17 and the word line 13 can be reduced by at least an area of a contact hole.

Further, since no contact hole is provided for the word line 13, the word line 13 in a floating state is not exposed to charged particles in the process of dry-etching for forming a contact hole and the silicon oxide film 143 serving as the tunnel insulating film of the memory cell transistor 12 will not be deteriorated.

In the non-volatile semiconductor memory device according to the present invention, the area necessary for the word line select transistor and the word line can be reduced by at least an area of a contact hole. Further, since the tunnel insulating film will not be deteriorated, the miniaturization and reliability of the device are improved.

In the method of making the non-volatile semiconductor memory device according to the present invention, direct contact is made between the word line and the conductive film to connect the word line to one of the impurity diffusion layers of the word line select transistor which is a thin film transistor and therefore, additional masking and etching steps are not needed, so that non-volatile semiconductor memory device of small size and high reliability can be made without increasing the fabrication cost.

Figure 8:
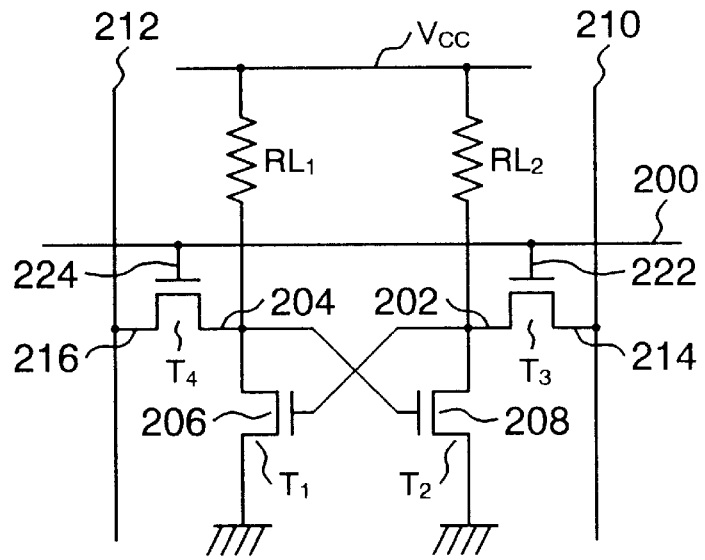
FIG. 8 is a circuit diagram showing a configuration of a memory cell of an SRAM.
Figure 9:
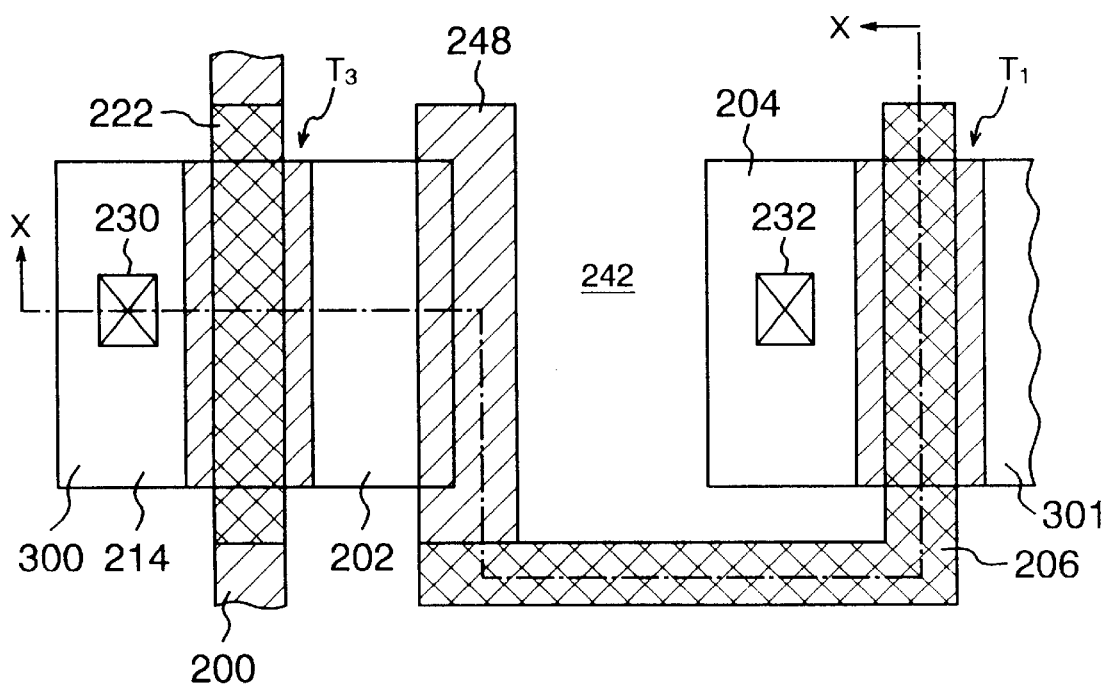
FIG. 9 is a plan view showing a configuration of a semiconductor device according to a third embodiment in which the present invention is applied to the SRAM.

Next, a third embodiment in which the present invention is applied to an SRAM will be described with reference to FIGS. 8 and 9. FIG. 8 is an equivalent circuit of one memory cell of the SRAM, showing loads RL1 and RL2 which are adapted to hold high voltage nodes charged with high voltage and are formed of, for example, MOS transistors or high-resistance polycrystalline silicon resistors. T1 and T2 designate memory transistors and T3 and T4 designate select transistors. Gate electrodes 222 and 224 of the select transistors T3 and T4 are connected to a word line 200. The memory transistors T1 and T2 have their drain/source circuits which are connected to a power supply Vcc through the loads RL1 and RL2, respectively, and their gate electrodes 206 and 208 which are connected to sources 202 and 204 of the select transistors T3 and T4, respectively. Drains of the select transistors T3 and T4 are connected to bit lines 210 and 212, respectively, the bit lines being in complementary relation with each other. Depending on which one of the memory transistors T1 and T2 is in conduction state, data written in this memory cell is determined as "1" or "0". When writing data in the memory cell, high voltage is applied to the 200 to the word line 200 to render the select transistors T3 and T4 conductive and depending on whether the data to be written is "1" or "0", high voltage is applied to one of the bit lines 210 and 212 and low voltage is applied to the other bit line so that one of the memory transistors T1 and T2 is rendered conductive. When reading written data, the high voltage is applied to the word line 200 to render the select transistors T3 and T4 conductive so that the bit line 210 or 212, which is connected to the select transistor T3 or T4 connected in series with one of the memory transistors T1 and T2 which is in conduction state, is rendered in grounded state. With this, it can be determined which one of the memory transistors T1 and T2 is in conduction state and the data written in the memory cell can be determined.

In the SRAM circuit as above, the gate electrodes of the memory transistors T1 and T2 are connected to the sources of the select transistors T3 and T4. The third embodiment of the present invention as applied to the connection between the transistor gate electrode and the transistor source will be described with reference to FIGS. 9, 10A to 10D. FIG. 9 is a plan view showing a circuit portion including the transistors T1 and T3 of the SRAM memory cell of FIG. 8 and FIGS. 10A to 10D show a section taken along X—X of FIG. 9.

Similarly to the first embodiment, in the third embodiment, too, an element isolation structure 242 is selectively formed on the surface of a semiconductor substrate to define element active regions 300 and 301 surrounded by the element isolation structure. In the element active region 300, the gate electrode 222 of the transistor T3 is formed on a surface of the semiconductor substrate with an intervening gate insulating film 243 and impurity diffusion layers 202 and 214 serving as the source and drain of the transistor T3 are formed on both sides of the gate electrode in the active region. The word line 200 covering the gate electrode 222 is formed of a polycrystalline silicon film.

On the other hand, the transistor T1 is formed in the element active region 301. Namely, in the active region 301, the gate electrode 206 of the transistor T1 is formed on the surface of the semiconductor substrate with an intervening gate insulating film 249, and impurity diffusion layers 204 and 301 serving as the source and drain of the transistor T1 are formed on both sides of the gate electrode. The gate electrode 206 is formed of a lower layer of first polycrystalline silicon film 244 and an upper layer of second polycrystalline silicon film 248 and the second polycrystalline silicon film 248 extends to the impurity diffusion layer 202 of the transistor T3 so as to be connected directly thereto. It is to be noted that the bit line 210 connected to the impurity diffusion layer 214 via a contact hole 230 and a wiring line connected to the load RL1 via a contact hole 232 have no relation to the present invention and are omitted in the drawing.

Figure 10A:
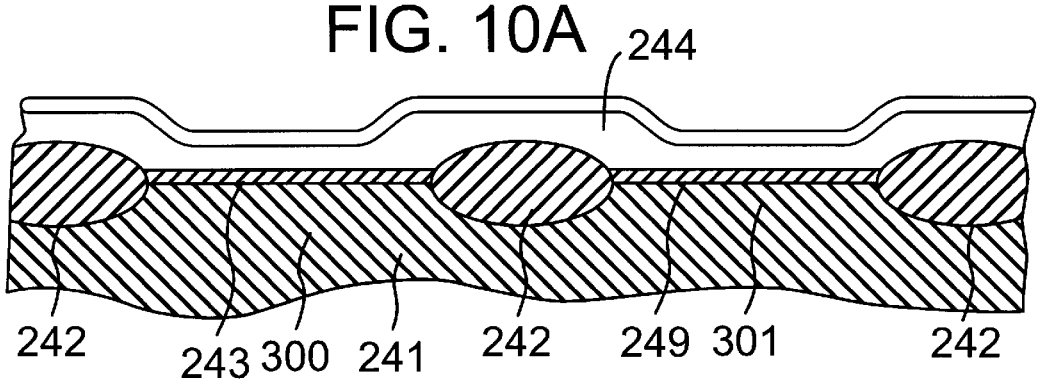
FIGS. 10A to 10D are sectional views taken along X—X of FIG. 9, for explaining a method of making the semiconductor device according to the third embodiment.

Next, a method of making element-to-element connection in the third embodiment will be described. As shown in FIG. 10A, an element isolation structure 242 is selectively formed on a surface of the semiconductor substrate 241 to define element active regions 300 and 301 surrounded by the element isolation structure. Subsequently, gate insulating films 243 and 249 are formed on the surface of the semiconductor substrate in the element active regions 300 and 301 by thermal oxidation. Then, a polycrystalline silicon film 244 is deposited on the whole surface of the substrate and an impurity such as phosphorus is ion-implanted.

Figure 10B:
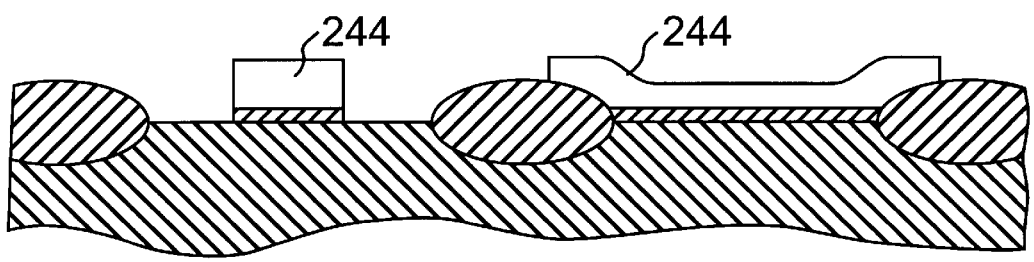

Subsequently, as shown in FIG. 10B, an unnecessary portion of the polycrystalline silicon film 244 is removed by etching using a resist film to retain the portions which serve as lower layers of the gate electrodes 222 and 206. At that time, the portion acting as the lower layer of the gate electrode 222 is made slightly larger than a predetermined shape of the gate electrode. At the same time, or by forming a new resist film, the gate insulating film 243 is removed at portions of the element active region 300 in which the impurity diffusion layers are to be formed, thereby exposing the surface of the semiconductor substrate.

Figure 10C:
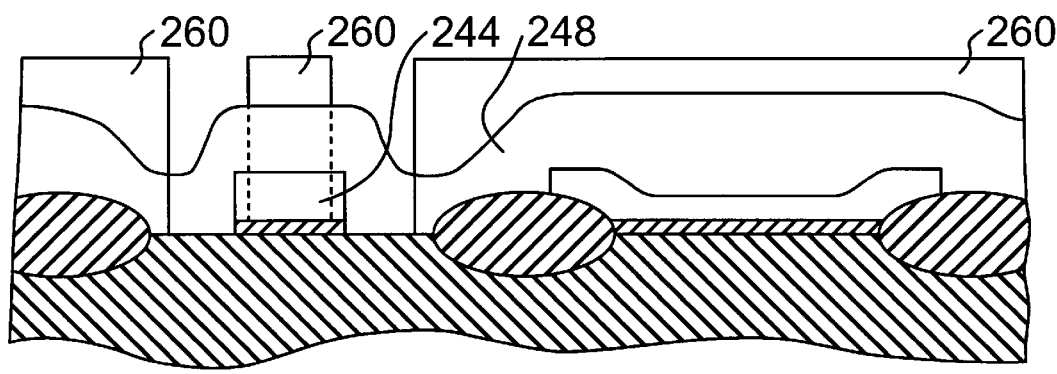
Figure 10D:
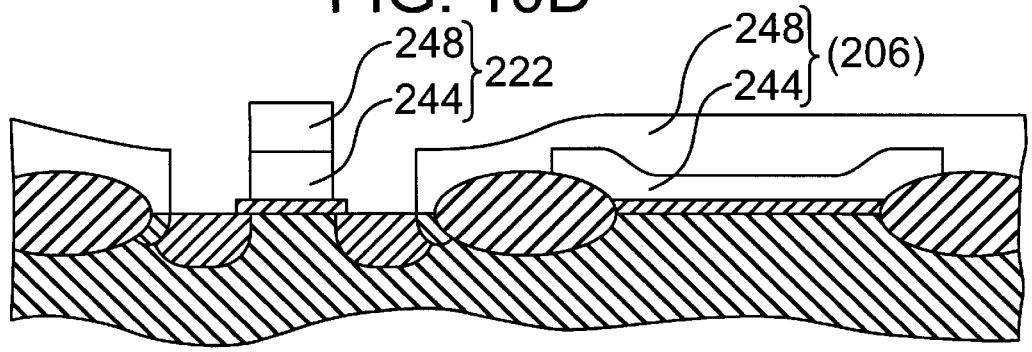

Subsequently, as shown in FIG. 10C, a second polycrystalline silicon film 248 is deposited on the whole surface of the semiconductor substrate and an impurity is introduced into the polycrystalline silicon film by a known technique such as ion-implantation. Then, the first and second polycrystalline silicon films are patterned by etching using a resist film 260 to form a lower layer of the gate electrode 222, an upper layer (word line 200) of the gate electrode and an upper layer of the gate electrode 206, as shown in FIG. 10D. At that time, the upper layer of the gate electrode 206 extends to reach a portion of the element active region 300 at which an impurity diffusion layer 202 of the transistor T3 is to be formed. Since the lower layer of the gate electrode 222 is formed slightly larger than the predetermined shape of the gate electrode as described previously, the lower layer of the gate electrode has a margin portion which slightly projects outwardly from the periphery of the upper layer. In this manner, the gate electrode 222 having a desired shaped is formed of the lower layer 244 and the upper layer 248. At that time, the lower layer of the gate electrode may not be etched to thereby keep unchanged in a shape shown in FIG. 10C. Further, the upper layer 243 of the gate electrode may be formed into a shape which surrounds the lower layer 244.

Subsequently, through a thermal treatment following the patterning of the second polycrystalline silicon film, an impurity contained in the polycrystalline silicon film is diffused into portions of the surface of the semiconductor substrate which are close to the element isolation region to form impurity diffusion layers 270 and 272. Thereafter, an impurity is introduced into exposed surface portions of the semiconductor substrate in the element active region through ion-implantation using the second polycrystalline silicon film 248 as a mask to form a pair of impurity diffusion layers 202 and 214 of the transistor T3. The impurity diffusion layer 272 ensures steady electrical connection between the second polycrystalline silicon film 248 and the impurity diffusion layer 202. Although not illustrated, the impurity diffusion layers of the transistor T1 are also formed in the element active region 301 by using the gate electrode 206 as a mask.

The third embodiment of the present invention has been described as being applied to the SRAM but it may be applied similarly to the case where one of a pair of impurity diffusion layers of a transistor is connected to a conductive layer of another electrical element in an ordinary semiconductor device, thereby making formation of the contact hole unnecessary to attain great advantages of miniaturization of the device and improvement in reliability over the conventional device in which connection is set up by using additional electric wiring.

I claim:

1. A semiconductor device comprising:
   a semiconductor substrate;
   a transistor including a gate insulating film formed on said semiconductor substrate, a gate electrode having a first conductive layer formed on said gate insulating film and a second conductive layer formed on said first conductive layer and a pair of impurity diffusion layers; and
   an electric element including a first insulating layer formed on said semiconductor substrate, a third conductive layer formed on said first insulating layer and positionally separated from said transistor, a second insulating layer formed on said third conductive layer and a fourth conductive layer formed on said second insulating layer;
   wherein said fourth conductive layer extends to connect directly to one of said pair of impurity diffusion layers, said first and third conductive layers are made of the same conductive material and said second and fourth conductive layers are made of the same conductive material.

2. A semiconductor device according to claim 1, wherein each of said first, second, third and fourth conductive layers contains silicon.

3. A semiconductor device according to claim 2, wherein said electric element is a non-volatile semiconductor memory element having a composite gate using said third conductive layer as a floating gate and said fourth conductive layer as a control gate.

4. A non-volatile semiconductor memory device comprising:
   a semiconductor substrate;
   a first transistor formed in a first region of said semiconductor substrate and having a laminated type gate structure including a floating gate, a control gate and an insulating film interposed therebetween; and
   a second transistor formed in a second region of said semiconductor substrate and having a gate electrode formed of at least a first conductive layer and a pair of impurity diffusion layers;
   wherein a second conductive layer constituting said control gate of said first transistor extends to connect directly to one of said pair of impurity diffusion layers of said second transistor, and said first and second conductive layers are made of the same conductive material.

5. A non-volatile semiconductor memory device according to claim 4, wherein said gate electrode of said second transistor includes a third conductive layer and said first conductive layer formed thereon.

6. A non-volatile semiconductor memory device according to claim 4, wherein said first transistor is a memory cell transistor of said non-volatile semiconductor memory device and said second conductive layer constitutes a word line.

7. A non-volatile semiconductor memory device according to claim 4, wherein said first transistor is formed in a first element active region surrounded by an element isolation region, said second transistor is formed in a second element active region which is separated from said first element active region by the element isolation region, said gate electrode of said second transistor includes a third conductive layer and said first conductive layer formed thereon, and said second conductive layer constituting said control gate of said first transistor provides a word line and extends over said element isolation region to connect to one of said pair of impurity diffusion layers of said second transistor formed in said second element active region.

8. A non-volatile semiconductor memory device according to claim 4, wherein said first transistor is formed in a first element active region surrounded by an element isolation region, said second transistor is a thin film transistor formed on the element isolation region, said pair of impurity diffusion layers of said second transistor are formed in a conductive layer made of the same material as that of a third conductive layer constituting said floating gate of said first transistor, said second conductive layer constituting said control gate of said first transistor provides a word line, and said word line extends over said element isolation region to connect directly to one of said pair of impurity diffusion layers of said second transistor.

9. A semiconductor device comprising:
   a semiconductor substrate;
   an element isolation structure formed on said semiconductor substrate to define at least first and second element active regions isolated by said element isolation structure;
   a first conductive layer formed over a surface of said semiconductor substrate across said first element active region and serving as a floating gate electrode of a first transistor, said first conductive layer having one end portion disposed on said element isolation structure;

a second conductive layer formed over the surface of said semiconductor substrate in said second element active region and serving as a gate electrode of a second transistor, said second transistor having a pair of impurity diffusion layers; and a third conductive layer formed over said first conductive layer with an insulating film interposed therebetween and extending over said element isolation structure so as to directly connect with one of said pair of impurity diffusion layers of said second transistor.

10. A semiconductor device according to claim 9, wherein said first transistor is a nonvolatile transistor and said third conductive layer acts as a control gate of said nonvolatile transistor.

* * * * *